United States Patent [19]

Ishida et al.

[11] Patent Number: 4,510,452
[45] Date of Patent: Apr. 9, 1985

[54] CIRCUIT HAVING SQUARE-LAW TRANSFER CHARACTERISTIC

[75] Inventors: Kohji Ishida; Masaharu Sakamoto, both of Tokyo, Japan

[73] Assignee: Pioneer Electronic Corporation, Tokyo, Japan

[21] Appl. No.: 389,770

[22] Filed: Jun. 18, 1982

[30] Foreign Application Priority Data

Jun. 18, 1981 [JP] Japan .................................. 56-94451

[51] Int. Cl.³ ............................................. G06G 7/12
[52] U.S. Cl. .................................... 328/144; 328/145; 307/494
[58] Field of Search ............... 328/144, 145, 160, 142; 307/492, 494

[56] References Cited

U.S. PATENT DOCUMENTS

| | | | |
|---|---|---|---|
| 3,348,154 | 10/1967 | Fish, Jr. et al. | 328/144 |
| 3,484,622 | 12/1969 | Keiper, Jr. et al. | 328/144 |
| 3,812,436 | 5/1974 | Fudemoto et al. | 328/144 |
| 4,019,118 | 4/1977 | Harwood | 328/144 |

Primary Examiner—Stanley D. Miller
Assistant Examiner—B. P. Davis
Attorney, Agent, or Firm—Fleit, Jacobson, Cohn & Price

[57] ABSTRACT

Disclosed is a frequency converter circuitry having square-law transfer characteristics.

In order to reduce undesirable harmonic components of the output signal, the circuitry comprises a plurality of active elements, each being responsive to respective harmonic components and having a characteristic adjusting means, connected in parallel with each other so as to provide an overall input/output transfer function approximating a square-law transfer characteristic.

2 Claims, 11 Drawing Figures

CIRCUIT HAVING SQUARE-LAW TRANSFER CHARACTERISTIC

BACKGROUND OF THE INVENTION

1. Field of the Invention

The present invention relates to frequency converters, but more specifically to circuits having square-law transfer characteristics.

2. Description of the Prior Art

A frequency converter circuit used in a radio receiver is so constructed that a signal having frequency of the sum or the difference of the original signal frequencies is produced from a couple of input signals by using non-linear characteristic of an active element such as a transistor.

The input/output transfer characteristic of a transistor is generally expressed as follows:

$$v_o = a_1 v_i + a_2 v_i^2 + a_3 v_i^3 + \ldots + a_n v_i^n \quad (1)$$

in which $v_o$ is output signal, $v_i$ is input signal, $v_i^n$ are harmonics of the input signal $v_i$, and $a_1, a_2, a_3 \ldots a_n$ are constants corresponding to the amplitude of the respective harmonics.

If two input signals having frequencies $f_1$ and $f_2$ are applied to this type of circuit, having non-linear characteristic, an output signal whose frequency is expressed as $mf_1 \pm nf_2$ (m and n are natural numbers) is produced. This output signal includes so called undesired harmonics, which cause the intermodulation interference.

Especially, it is known that the component of the output signal $v_o$ corresponding to the odd harmonic terms of the equation (1) causes the strong intermodulation interference.

A circuit is therefore proposed by the inventor in which the signal component corresponding to the odd harmonic terms of the equation (1) is decreased to prevent the intermodulation interference.

However, in these types of circuits, the signal component corresponding to the even terms (especially to the fourth term) still remains and also causes intermodulation interference.

SUMMARY OF THE INVENTION

An object of the present invention is therefore to provide a circuit having a square-law characteristic in which the frequency component of the output signal corresponding to the even harmonic terms above the fourth term, as well as the odd harmonic terms is cancelled thereby to more completely prevent the intermodulation interference.

Another object of the present invention is to provide a circuitry having a square-law characteristic suitable for a frequency converter circuit in which the intermodulation interference is completely eliminated by suppressing the undesired harmonic waves.

According to the present invention, a circuitry having square-law characteristic comprises a plurality of active elements, each having a control input and at least one controlled output, the control inputs and controlled outputs are respectively commonly connected with each other, and a plurality of characteristic adjusting means provided for each of the active elements, the characteristic adjusting means being adjusted so that input/output characteristic of the circuitry has a transfer function approximating a square-law characteristic thereby suppressing undesired harmonic waves and thus prevent the intermodulation interference.

The foregoing and other objects and advantages of the invention will become more clearly understood upon review of the following description taken in conjunction with the accompanying drawings.

DETAILED DESCRIPTION OF THE PREFERRED EMBODIMENTS

Figure 1:
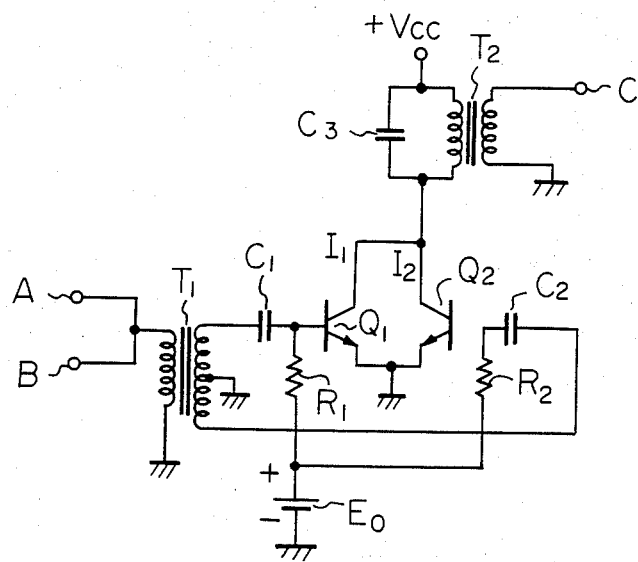
FIG. 1 is a circuit diagram of a frequency converter circuit.

FIG. 1 shows an example of the frequency converter circuit having an improved transfer function to reduce or eliminate intermodulation interference.

In FIG. 1, a pair of input signals A, B having different frequencies are simultaneously applied to a common input of a primary winding of transformer $T_1$.

A center tap of the secondary winding of transformer $T_1$ is grounded so that positive and negative polarities of a superimposed signal $(A+B)$ of the input signals A and B are obtained at the two extremities of transformer $T_1$.

The positive and negative superimposed signals $\pm(A+B)$ are respectively applied to the bases of a pair of transistors $Q_1$, $Q_2$ through a pair of respective capacitors $C_1$, $C_2$.

The emitters of the transistors $Q_1$ and $Q_2$ are commonly connected to a ground reference level.

The collectors of the transistors $Q_1$ and $Q_2$ are also commonly connected to a common load, that is a tuning circuit which comprises a capacitor $C_3$ and a transformer $T_2$.

An output signal having desired frequency components is selectively produced by the operation of this tuning circuit.

The bias currents of the transistors $Q_1$ and $Q_2$ are supplied from a power supply $E_o$, through resistors $R_1$ and $R_2$.

If the transistors $Q_1$ and $Q_2$ are selected so that the input/output transfer characteristics thereof are uniform, and each transistor has the characteristic expressed by the equation (1), then the components of output signals $\Delta I_1$ and $\Delta I_2$ of the transistors $Q_1$ and $Q_2$, corresponding to the third term $(A_3 V_i^3)$ are derived as a function of $\mp(A+B)^3$ respectively.

Therefore, the component corresponding to the third term is cancelled at the commonly connected collectors of the transistors $Q_1$ and $Q_2$.

Similarly, the component corresponding to each of the fifth, seventh, and other add terms is cancelled.

On the other hand, the components $\Delta I_1'$ and $\Delta I_2'$ of the output signals of the transistors $Q_1$ and $Q_2$ corresponding to the second term $(A_2 V_i^2)$ are derived as a function of $(A+B)^2$, therefore they are in phase with each other.

Consequently, those components $\Delta I_1'$ and $\Delta I_2'$ are doubled at the common junction of the collectors.

However, since the components of the output signals corresponding to the fourth term is also doubled by the summation, those residual components cause the intermodulation interference as described hereinbefore.

The principle of the present invention will now be described with reference to FIGS. 2A and 2B to FIGS. 4A and 4B which show several modes of transistor circuit, for the purpose of better understanding of the present invention.

Figure 2A:
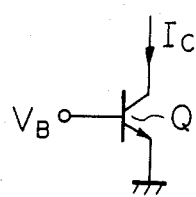
FIGS. 2A through 4B are the illustrations of various types of transistor groundings, for the purpose of the explanation of the principles of the present invention.

FIG. 2A shows a mode of bipolar transistor operation wherein the emitter of the transistor is directly grounded.

Figure 2B:
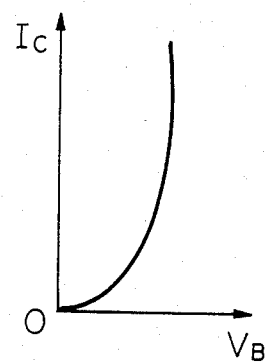

The input/output transfer characteristic of this emitter ground transistor circuit is shown in FIG. 2B.

As shown in FIG. 2B, the output current $I_C$ of the transistor varies with the input voltage $V_B$ along an exponential curve of steep inclination.

Figure 3A:
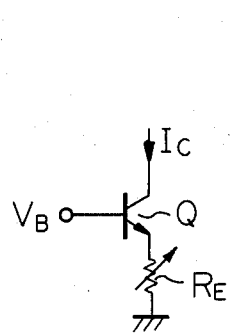
Figure 3B:
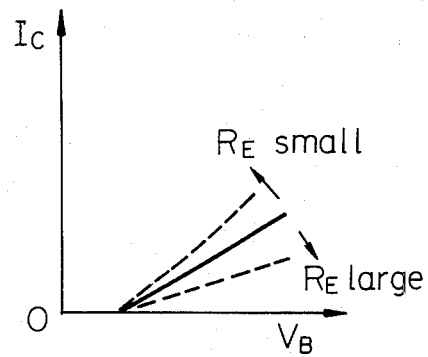

Turning to FIG. 3A, a second type of grounded-emitter circuit is illustrated. As shown, a resistor $R_E$ is provided between the emitter of the transistor Q and the ground.

In the case of this second type circuit, the mutual conductance (gm) of the transistor Q decreases with the AC and DC feedback operation of the resistor $R_E$.

Consequently, the inclination of the input/output transfer characteristic curve becomes less steep, further the linearity of the circuit is improved at the same time.

In addition, the inclination of the characteristic curve can be adjusted by varying the resistance of the resistor $R_E$.

Figure 4A:
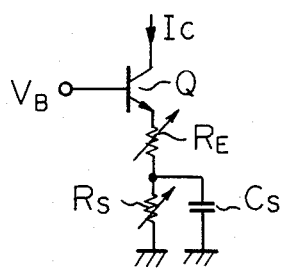

Reference is now made to FIG. 4A in which a third type of grounded-emitter circuit is illustrated.

As shown, a series resistor $R_S$ is connected in series to an emitter resistor $R_E$ similar to the resistor $R_E$ in FIG. 3A.

A capacitor $C_S$ is further provided in parallel to the series resistor $R_S$ so as to bypass AC potential developed between the terminals of resistor $R_S$.

Figure 4B:
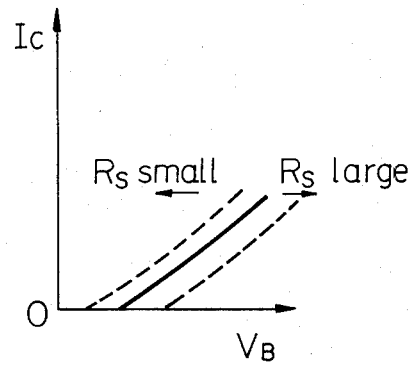

As shown in FIG. 4B, the input/output transfer characteristic curve can be shifted along the arrows in accordance with the resistance of the series resistor $R_S$.

The present invention is based on the consideration of various grounded-emitter transistor circuits described hereinabove, and especially on the circuit shown in FIG. 4A in which the input/output transfer characteristic is adjustable by varying the resistance of the emitter resistor $R_E$ and the series resistor $R_S$.

The first embodiment of the present invention will be explained with reference to FIG. 5 first.

Figure 5:
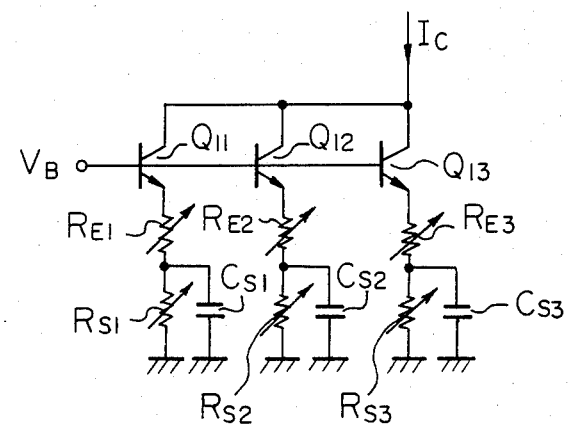
FIG. 5 is a circuit diagram of the first embodiment of the present invention.

In FIG. 5, three transistors $Q_{11}$, $Q_{12}$ and $Q_{13}$ with commonly connected respective bases (the controlled inputs thereof) are arranged in parallel to produce an output signal at commonly connected collectors (the controlled outputs) thereof.

These transistors $Q_{11}$, $Q_{12}$, $Q_{13}$ are provided with a distinct characteristic adjustment circuit respectively connected between the emitter (the controlled terminal) thereof and the ground.

Each characteristic adjustment circuit has the same construction as shown in FIG. 4A, that is, a series circuit of an emitter resistor $R_{E1}$ to $R_{E3}$, and a series resistor $R_{S1}$ to $R_{S3}$, and a capacitor $C_{S1}$ to $C_{S3}$ connected in parallel thereto which bypasses AC potential developed between the terminals of the series resistor $R_{S1}$ to $R_{S3}$.

By varying the resistance of the emitter resistors $R_{E1}$ to $R_{E3}$, the mutual conductance gm of the transistor is adjusted so as to change the inclination of the transfer characteristic curve and to vary the linearity thereof.

Also, by varying the resistance of the series resistors $R_{S1}$ to $R_{S3}$, the amount of lateral shift of the transfer characteristic curve is desirably determined.

Figure 6:
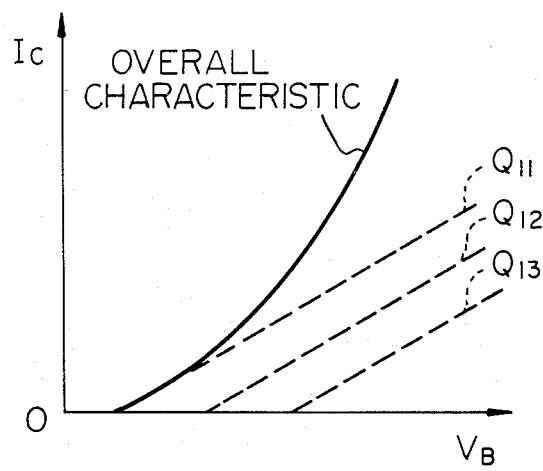
FIG. 6 is a diagram showing the characteristic of the circuit shown in FIG. 5.

Assuming that $R_{E1} = R_{E2} = R_{E3}$ and $R_{S1} < R_{S2} < R_{S3}$, the input/output transfer characteristic curve of each transistor $Q_{11}$ to $Q_{12}$ can be shown by the dashed lines of FIG. 6.

Also, the overall input/output transfer characteristic of this circuit can be shown by the solid line of FIG. 6.

Therefore, a close approximation of square-law characteristic may be obtained by appropriately adjusting the resistance value of each resistors $R_{E1}$ to $R_{E3}$ and $R_{S1}$ to $R_{S3}$.

In this circuit, the output current $I_C$ is free from the component corresponding to the odd terms and the even terms (above fourth) of the equation (1), that is, undesired waves and is expressed as follows:

$$I_C \approx aV_B^2$$

where $V_B$ is input voltage.

Therefore, spurious disturbance such as intermodulation interference is prevented form occurring when used in a frequency converter circuit.

Figure 7:
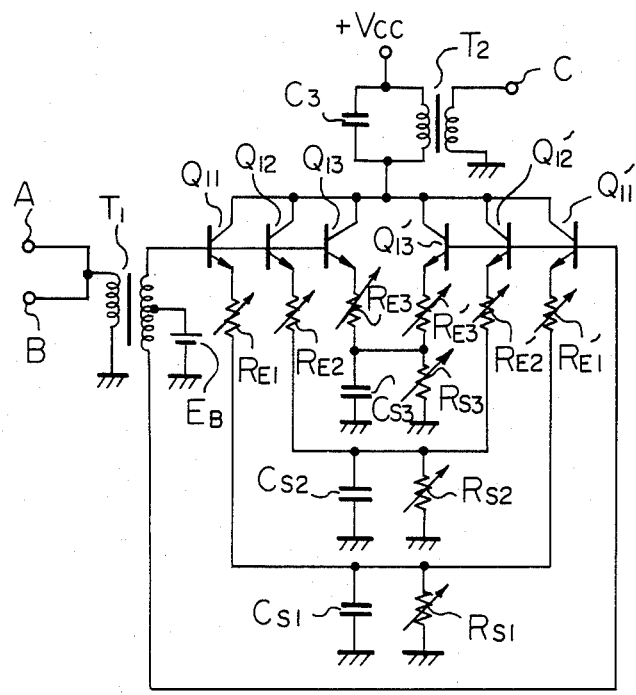
FIG. 7 is a circuit diagram of a second embodiment of the present invention.

FIG. 7 shows an example of a frequency converter circuit which utilizes the circuit shown in FIG. 5.

As shown, the frequency converter circuit is made up of a first group of elements which comprises transistors $Q_{11}$ to $Q_{13}$ and a second group of elements which comprises transistors $Q_{11}'$ to $Q_{13}'$ and a tuning circuit as a common load of the first and second groups of elements, which is connected at commonly connected collectors of the transistors $Q_{11}$ to $Q_{13}$, and $Q_{11}'$ to $Q_{13}'$.

The transistors $Q_{11}$ to $Q_{13}$ and $Q_{11}'$ to $Q_{13}'$ of each group of elements are provided with emitter resistors $R_{E1}$ to $R_{E3}$ and $R_{E1}'$ to $R_{E3}'$ for the adjustment of mutual conductance gm of each transistor.

Series resistors $R_{S1}$ to $R_{S3}$ and $R_{S1}'$ to $R_{S3}'$ are provided for adjusting the amount of shift of the input/output transfer characteristic curve of each transistor, and capacitors $C_{S1}$ to $C_{S3}$ and $C_{S1}'$ to $C_{S3}'$ for bypassing the AC current are also provided respectively to the emitter circuit of each transistor.

Each group of elements is respectively supplied, at its common input, with a positive or a negative signal $\pm(A+B)$ of a superimposed signal of a pair of input signals A and B via an input transformer $T_1$.

Figure 8:
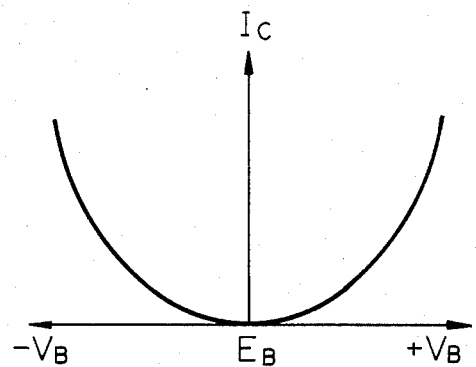
FIG. 8 is a diagram showing the I-V characteristic of the circuit shown in FIG. 7.

The thus constructed circuit exhibits a total input/output transfer characteristic as shown in FIG. 8 which is an almost perfect square-law characteristic, in which a sum or a differential frequency signal is produced from a pair of input signals A and B.

By employing this frequency converter circuit, it becomes possible to provide a receiver with high sensibility which is free from intermodulation interference due to the spurious disturbance.

Above, preferred embodiments of the present invention have been described. It should be understood, however, that the foregoing description has been for illustrative purpose only, and is not intended to limit the scope of the invention. Rather, there are numerous equivalents to the preferred embodiments, and such are intended to be covered by the appended claims.

For example, the number of transistors which forms the circuitry may be increased more than three.

Also, various types of elements may be used as the active elements for the circuitry.

Furthermore, the circuitry according to the present invention may be used not only for a frequency converter circuit as described hereinabove; but also for various other circuits such as a frequency multiplier circuit, a multiplier or converter circuit according to a quarter-law, or any circuit requiring a particular transfer function as designed by selecting proper resistive and capacitive levels for the emitter circuits of the respective transistors.

What is claimed is:

1. A circuitry having square-law characteristics comprising:
    (a) a first and second group of active elements, each of said first and second group comprising a plurality of active elements, each active element having a control input and at least one controlled output and a controlled terminal other than said controlled output, said control inputs and said controlled outputs are respectively commonly connected with each other, and a plurality of characteristic adjusting means each of which includes an adjustable feedback resistor connected between said controlled terminal and a reference potential point and a capacitor for bypassing an AC potential developed across a portion of said adjustable feedback resistor, and distinct adjusting means provided for a pair including one of said plurality of active elements of said first group and a corresponding one of said plurality of active elements of said second group; and
    (b) means for applying said control inputs of said active elements of said first and second groups with in-phase and anti-phase input signals respectively delivered from an input signal, wherein said controlled outputs of said active elements of first and second groups are commonly connected, and wherein said characteristic adjusting means are adjusted so that input/output transfer characteristic of the circuitry is an approximate square-law characteristic.

2. A circuitry as recited in claim 1, wherein said input signal is superimposed signal of first and second signals having different frequencies, and the circuitry produces a signal having frequency of the sum of the difference of frequencies of said first and second signals.

* * * * *